US 9,761,283 B2

(12) United States Patent
Plavec et al.

(10) Patent No.: US 9,761,283 B2
(45) Date of Patent: Sep. 12, 2017

(54) MEMORY CIRCUIT INCLUDING A CURRENT SWITCH AND A SENSE AMPLIFIER

(71) Applicant: EM Microelectronic-Marin SA, Marin (CH)

(72) Inventors: Lubomir Plavec, Brno (CZ); Filippo Marinelli, Lussy-sur-Morges (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 15/085,392

(22) Filed: Mar. 30, 2016

(65) Prior Publication Data

US 2016/0372163 A1     Dec. 22, 2016

(30) Foreign Application Priority Data

Jun. 18, 2015  (EP) .................................... 15172706

(51) Int. Cl.
| | |
|---|---|
| *G11C 11/21* | (2006.01) |
| *G11C 7/06* | (2006.01) |
| *G11C 7/12* | (2006.01) |
| *G11C 16/26* | (2006.01) |

(52) U.S. Cl.
CPC ............ *G11C 7/062* (2013.01); *G11C 7/067* (2013.01); *G11C 7/12* (2013.01); *G11C 16/26* (2013.01); *G11C 2207/063* (2013.01)

(58) Field of Classification Search
CPC ......... G11C 7/062; G11C 7/067; G11C 16/26; G11C 16/24; G11C 2207/063
USPC .................................................. 365/189.02
See application file for complete search history.

(56) References Cited

U.S. PATENT DOCUMENTS

| 7,443,198 | B1 | 10/2008 | McCollum et al. |
| 8,416,602 | B2* | 4/2013 | Kitagawa ............. G11C 7/1048 |
| | | | 365/148 |
| 8,422,269 | B2* | 4/2013 | Sasaki ................ G11C 13/0026 |
| | | | 365/148 |
| 2004/0008540 | A1 | 1/2004 | Mihara |
| 2009/0040835 | A1 | 2/2009 | Ogawa |
| 2009/0213665 | A1 | 8/2009 | Utsunomiya |
| 2011/0199812 | A1* | 8/2011 | Kitagawa ............. G11C 7/1048 |
| | | | 365/148 |

(Continued)

FOREIGN PATENT DOCUMENTS

EP        2 093 770 A1    8/2009

OTHER PUBLICATIONS

European Search Repot issued Dec. 7, 2015 in European Application 15172706.2 filed Jun. 18, 2015 ( with written opinion).

*Primary Examiner* — Pho M Luu
*Assistant Examiner* — Xiaochun L Chen
(74) *Attorney, Agent, or Firm* — Oblon, McClelland, Maier & Neustadt, L.L.P.

(57) ABSTRACT

A memory circuit is provided, including at least one bit cell configured to store data and having a first terminal and a second terminal, one of the terminals being coupled to a bit-line; at least one current switch connected to the bit-line and connected to a current source and being configured to selectively provide at least a read current to the bit cell; and a sense amplifier having at least one input connected to a sensing node on the bit-line, wherein the sensing node is disposed between the bit cell and the at least one current switch.

22 Claims, 2 Drawing Sheets

(56) References Cited

U.S. PATENT DOCUMENTS

2011/0235394 A1\* 9/2011 Sasaki ............... G11C 13/0026
365/148

\* cited by examiner

MEMORY CIRCUIT INCLUDING A CURRENT SWITCH AND A SENSE AMPLIFIER

This application claims priority from European Patent Application No. 15172706.2 filed Jun. 18, 2015, the entire disclosure of which is hereby incorporated herein by reference.

TECHNICAL FIELD

The present invention relates to the field of memory circuits and in particular to digital memory circuits for electronic devices. The invention relates to memory circuits especially for mobile electronic devices that require only a minimum of electric energy for reading of the stored data.

BACKGROUND OF THE INVENTION

For portable or mobile electronic devices, such like cellular phones, tablet computers, watches and the like, it is a general aim to reduce the electric power consumption in order to prolong lifetime of a battery or to make use of rather compact rechargeable batteries that provide only limited energy storage capacities. Almost all kinds of digital electronic devices make use of a memory circuit. The U.S. Pat. No. 5,754,010 for instance discloses a Flash memory array having a memory circuit with a bit cell coupled to a bit-line and further having a pre-charge circuit that provides a pre-charge current to the bit-line during a pre-charge time. Pre-charging of numerous bit-lines in the memory array prior to a 'read' operation draws a large current from a portable battery for charging the capacitive load on each bit-line.

For a readout of a bit cell or memory cell, a current flowing through that particular cell is compared with a reference current by means of a sense amplifier. With conventional memory circuits such as disclosed in the U.S. Pat. No. 5,754,010, a NMOS-type multiplexer is connected with its drain to the input of the sense amplifier. The source of such a NMOS multiplexer is connected to the bit-line. Since such NMOS-type multiplexers exhibit a substantial and negligible threshold voltage, the lowest possible voltage level on the memory bit-line is limited by the voltage on the gate of such NMOS multiplexers and hence by the threshold voltage of such a NMOS transistor.

Typically, the maximum voltage on the memory bit-line Vbl is about the voltage on the gate of the NMOS multiplexer Vg minus the threshold voltage Vth of the NMOS multiplexer. So a minimum supply voltage for reading of the memory must be quite high. Since the NMOS multiplexer may also have to support a high voltage level for erasing and for writing of the at least one bit cell or memory cell, such multiplexers have to be composed of NMOS transistors that exhibit a rather high threshold voltage. A rather high threshold voltage of the NMOS multiplexer further reduces the voltage level on the memory bit-line for a given supply voltage. Moreover, a rather high threshold voltage of the NMOS multiplexer for programming a memory cell counteracts lowering of the supply voltage for reading of the stored data.

The bit-line voltage limits the memory cell current and therefore has an impact to the memory access time and minimal read voltage. The voltage on the gate of the NMOS-type multiplexer is either equal to the supply voltage of the memory circuit or it can be created by a pre-charge circuit, hence by a so called charge pump. Use and implementation of such a pre-charge circuit usually leads to a larger power consumption and requires implementation of a rather complicated control circuit, e.g. including a clock for the charge pump.

SUMMARY OF THE INVENTION

It is therefore an aim of the present invention to provide a different approach and a beneficial architecture for a memory circuit providing and supporting a lowering and reduction of the supply voltage without using a charge pump or pre-charge circuit so that reading of the data can be conducted only on the basis of a given supply voltage.

In one aspect, the present invention relates to a memory circuit comprising at least one bit cell for storing data. The bit cell has a first terminal and further has a second terminal. At least one of said terminals is coupled to a bit-line. In addition, the memory circuit comprises at least one current switch or multiplexer that is connected to the bit-line and which is further connected to a current source. The current switch is switchable and is therefore operable to selectively provide a current to the bit cell. The bit-line connected to the bit cell via the first or second terminal of the bit cell is connectable to the current source through switching of the current switch. The memory circuit further comprises a sense amplifier having at least one input connected to a sensing node located on the bit-line. The sensing node is located between the bit cell and the at least one current switch. In other words, the sensing node connected to the sense amplifier is located on the bit-line between the current switch and that one of first or second terminals via which the at least one bit cell is coupled or connected to the bit-line.

In this way the input of the sense amplifier is directly connected to the bit-line but is separated from the current source via the at least one current switch.

Consequently, the voltage on the bit-line can be close to the supply voltage when the memory cell is non-conductive or when the memory cell is off. The voltage can be pulled down to zero volt by the memory cell if the memory cell current is higher than the reference current of the sense amplifier. The voltage on the bit cell can therefore be higher compared to prior art solutions as described above. So the at least one bit cell can be provided with a higher current at a lower supply voltage Vdd. In this way the supply voltage in a read mode of the memory circuit can be reduced without the necessity of implementing a pre-charge circuit or a charge pump. In effect, a low read power consumption and a simple control of the memory circuit can be provided.

According to another embodiment, the current switch comprises a PMOS device or a PMOS transistor comprising a source and a drain, wherein one of the source and the drain is connected to the current source and wherein the other one of the source and the drain of the PMOS transistor is connected to the bit-line. This solution is of particular advantage since a conventionally used NMOS-type switch just has to be replaced by a PMOS-based switch, e.g. by a PMOS transistor and by rearranging the sensing node of the sense amplifier from the source to the drain of said transistor or vice versa. When the current switch is implemented as a PMOS transistor the source of said transistor is connected to the current source while the drain of said transistor is connected to the bit-line and to the sensing node of the sense amplifier. In this way the voltage level on the bit-line may equal the supply voltage if the at least one bit cell is non-conductive.

According to a further embodiment, it is then also the first terminal of the memory cell that is connected to the bit-line.

According to another embodiment, the current switch comprises a NMOS transistor that comprises a source and a drain, wherein one of the source and the drain is connected to the current source and wherein the other one of the source and the drain of the NMOS transistor is connected to the bit-line. With this embodiment, it is typically the second terminal of the memory cell that is connected to the bit-line while the first terminal of the memory cell is connected to the supply voltage. Also here and if the memory cell is non-conductive, the voltage level at the sensing node may be as high as the supply voltage Vdd. When the current switch is based on NMOS components, it is typically the source of the respective NMOS transistor that is connected to the sensing node of the sense amplifier while the drain of the NMOS transistor is connected to the current source, which is implemented as a sink to Vss.

According to a further embodiment, the memory circuit does not only comprise one bit cell but at least a first and a second bit cells. Then, the memory circuit also comprises at least a first and a second bit-lines coupled to the first and to the second bit cells, respectively. In other words, the first bit-line is coupled or connected to the first bit cell and the second bit-line is coupled or connected to the second bit cell. First and second bit-lines are typically isolated from each other.

In this embodiment, the memory circuit also comprises at least a first and a second current switches connected to the first and to the second bit-lines, respectively. Hence, the first current switch is connected to the first bit-line and the second current switch is connected to the second bit-line. So the first current switch is integrated into the first bit-line and the second current switch is integrated into the second bit-line. The first and second current switches are both connected to one and the same current source. Each one of first and second current switches is further operable to selectively provide a current to one of the first and second bit cells.

By means of the first and second current switches either the first or the second bit cell can be provided with a respective current, typically by a read current. First and second current switches are controlled in such a way, that only one of first and second current switches establishes a connection to the current source while the other one of first and second current switches isolates the respective bit-line from the current source.

In another embodiment with at least first and second bit cells, the sense amplifier of the memory circuit has a first amplifier stage. Said first amplifier stage comprises a first amplifier circuit connected to a first sensing node on the first bit-line. Here, the first sensing node is located between the first bit cell and the first current switch. The first amplifier stage further comprises at least a second amplifier circuit. The second amplifier circuit is connected to a second sensing node on the second bit-line. The second sensing node is located between the second bit cell and the second current switch. In this way the sense amplifier is split into a first amplifier stage with first and second amplifier circuits, each of which belonging to or being connected to respective first and second bit-lines. Hence, at least a portion of the sense amplifier, namely its first amplifier stage is split among first and second bit-lines. So each of first and second bit-lines comprises an own amplifier circuit that is connected to a second stage of the sense amplifier.

Accordingly and in another embodiment, the sense amplifier comprises a data multiplexer in a second amplifier stage. The data multiplexer is individually connected with outputs of each of the first and second amplifier circuits of the first amplifier stage. The data multiplexer therefore comprises at least two separate inputs, one for each of first and second amplifier circuits of the first amplifier stage.

According to another embodiment, the data multiplexer of the sense amplifier and the at least first and second current switches are mutually coupled for synchronously switching to only one of the at least first and second bit cells. If for instance the first bit cell should be subject to readout the first current switch is switched on so as to provide a read current to the first bit cell. Simultaneously also the data multiplexer of the second stage of the sense amplifier is switched to receive and to read the output of the first amplifier circuit of the first amplifier stage of the sense amplifier that is actually connected to the first bit-line.

Hence, for reading of a particular memory cell switching of two components, namely of the current switch and of the data multiplexer is necessary. This may seem to be somewhat complicated as compared to the prior art. But since this architecture allows for a reduction of power consumption in the read mode, the advantages in terms of power consumption easily make up for the disadvantages in terms of switching efforts.

According to another embodiment, at least one of the first and the second amplifier circuits comprises an inverter that is directly connected to the respective bit cell. Since the voltage level on the bit-line may be as high as the supply voltage, also the respective amplifier circuits of the first amplifier stage may be on a voltage level in the region of the supply voltage Vdd. Hence, the output of the first and second amplifier circuits and hence of respective inverters thereof may be on or around the level of the supply voltage. This is of particular benefit for the further digital data processing.

According to another embodiment, the at least first and second amplifier circuits of the first stage of the sense amplifier are high-voltage tolerant at least to voltage levels suitable for erasing or writing data in the first or second bit cells. So in the present terminology a high-voltage level refers to such voltage levels that are suitable for erasing or writing data in the first or second bit cells.

Since the first and second amplifier circuits are high-voltage tolerant they can be directly connected to the first and second bit-lines. In a write or erase mode of the memory circuit, they serve as an isolating component protecting the data multiplexer from unsuitably high voltage levels.

In general, the memory circuit is by no way limited to only a first and a second bit cell, but the concept as described above with first and second bit cells, first and second bit-lines as well as first and second amplifier circuits and first and second current switches is generally extendable to n cells, n bit-lines, n current switches and n amplifier circuits, wherein n is an integer number larger than 2.

Accordingly and in a further embodiment, the memory circuit comprises n bit cells and n bit-lines. The memory circuit further comprises n current switches. Here, one of the n bit-lines is coupled to one of the n bit cells. Typically, each bit-line is coupled to one bit cell. In other words each bit cell is coupled to one bit-line. Each one of the n current switches is connected to a common current source. Each one of the current switches is further connected to only one of the bit-lines. In other words, each one of the n bit-lines is connected to only one current switch. In this way a current provided by the current source can be selectively provided and supplied to only one of the n bit-lines and hence to only one of the n bit cells at a time.

According to a further embodiment, the memory circuit also comprises n amplifier circuits connected to n sensing nodes on n bit-lines. Each one of the n amplifier circuits is connected to only one of the n bit-lines. Each one of the n bit-lines is connected to only one of the n amplifier circuits.

Each output of the n amplifier circuits is connected to the data multiplexer. Hence, the data multiplexer comprises n inputs, each of which being connected to only one of the amplifier circuits connected to one bit-line.

The memory circuit is generally implementable in different ways and may be generally applicable to different types of memory cells, such like EEPROM-type memories, Flash type memories, OTP, ROM or RAM-type memories just to mention a few.

In another aspect, the invention also relates to an electronic device. The electronic device comprises at least a processor, an electric energy supply and at least one of an input or output. While the processor is configured to process digital data, the electric energy supply provides the respective energy for driving of the processor. By means of at least one input or output, a data communication to the environment, e.g. to other electronic devices or to end consumers can be provided. In addition, the electronic device comprises at least one memory circuit as described above. The memory circuit is typically connected in a data transferring way to the processor and/or to one of the input or output.

BRIEF DESCRIPTION OF THE DRAWINGS

Other features and advantages of the invention will become apparent from the following description of non-limiting exemplary embodiments, with reference to the appended drawings, in which.

DETAILED DESCRIPTION OF EMBODIMENTS OF THE INVENTION

Figure 1:
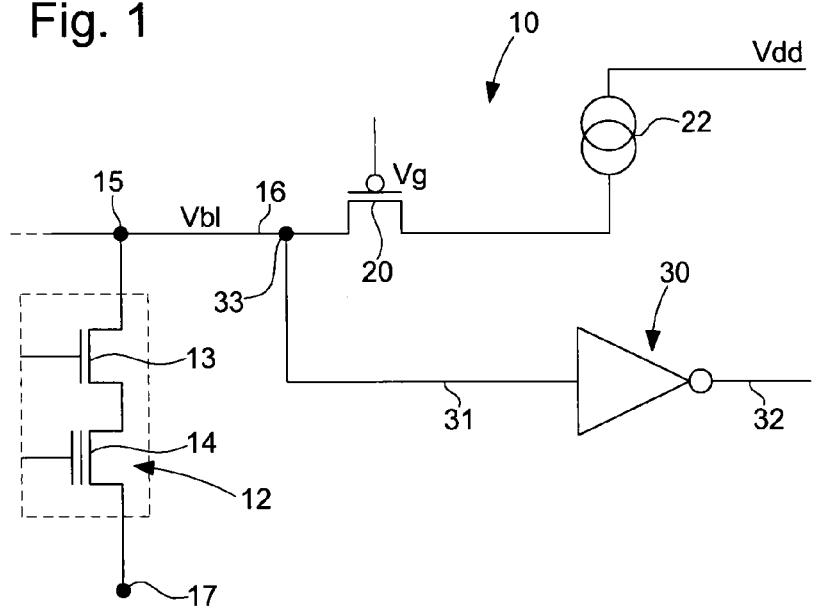
FIG. 1 shows a PMOS-type implementation of a memory circuit according to the present invention.

The memory circuit 10 as illustrated in FIG. 1 comprises a bit cell 12 having a first terminal 15 connected to a bit-line 16. A second terminal 17 can be connected to Vss. As it is illustrated the bit cell 12 comprises two transistors 13, 14, one of which acting as a select transistor and the other one of which acting as a control transistor. The bit-line 16 is connected to a current switch or multiplexer 20, which is implemented as a PMOS transistor. The drain of said transistor 20 is connected to the first terminal 15 of the bit cell 12 whereas the source of said transistor 20 is connected to a current source 22, which is further connected to a supply voltage Vdd. There is further provided a sense amplifier 30 having at least one input 31 and an output 32.

In the embodiment according to FIG. 1, the input 31 of the sense amplifier 30 is connected to a sensing node 33 that is located on the bit-line 16 between the current switch 20 and the first terminal 15 of the bit cell 12. Hence, the input 31 of the sense amplifier 30 is directly and permanently connected to the bit-line 16 and hence to the bit cell 12. As illustrated in FIG. 1, the sense amplifier 30 is configured as an inverter. So if the voltage at the input 31 is close to Vdd, which is the case when the bit cell 12 is non-conductive, then the output 32 of the sense amplifier 30 will be zero. In the other configuration, where the bit cell 12 is conductive the input 31 of the sense amplifier 30 will be close to zero volt and hence the output 32 of the sense amplifier 30 will represent a logical 1.

Figure 3:
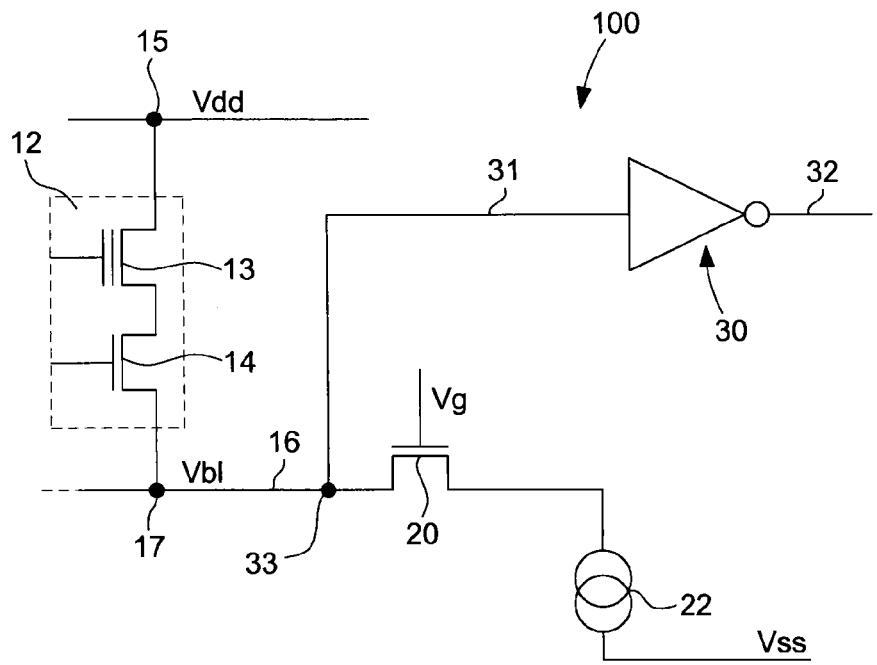
FIG. 3 shows an alternative embodiment of the memory circuit with NMOS-type components.

In FIG. 3, a further embodiment of a memory circuit 100 is illustrated. There, identical or like components are denoted with identical or similar reference numbers as used in FIG. 1.

The memory circuit 100 as shown in FIG. 3 is implemented as a NMOS architecture. There, the memory cell 12 also comprises two transistors 13, 14 and further has a first terminal 15 and a second terminal 17. The first terminal 15 is connected to the supply voltage Vdd whereas the second terminal 17 is connected to the bit-line 16. Implementation of the sense amplifier 30 is identical or equivalent to the implementation as already described in connection to FIG. 1. But in FIG. 3, the current switch 20 is implemented as a NMOS transistor. The source of this current switch 20 or transistor is connected to the bit-line 16, whereas the drain of the current switch 20 is connected to a current source 22, which is connected to Vss. Operation and the characteristics of the memory circuit 100 is somewhat identical to the memory circuit 10 as described in connection to FIG. 1.

Figure 2:
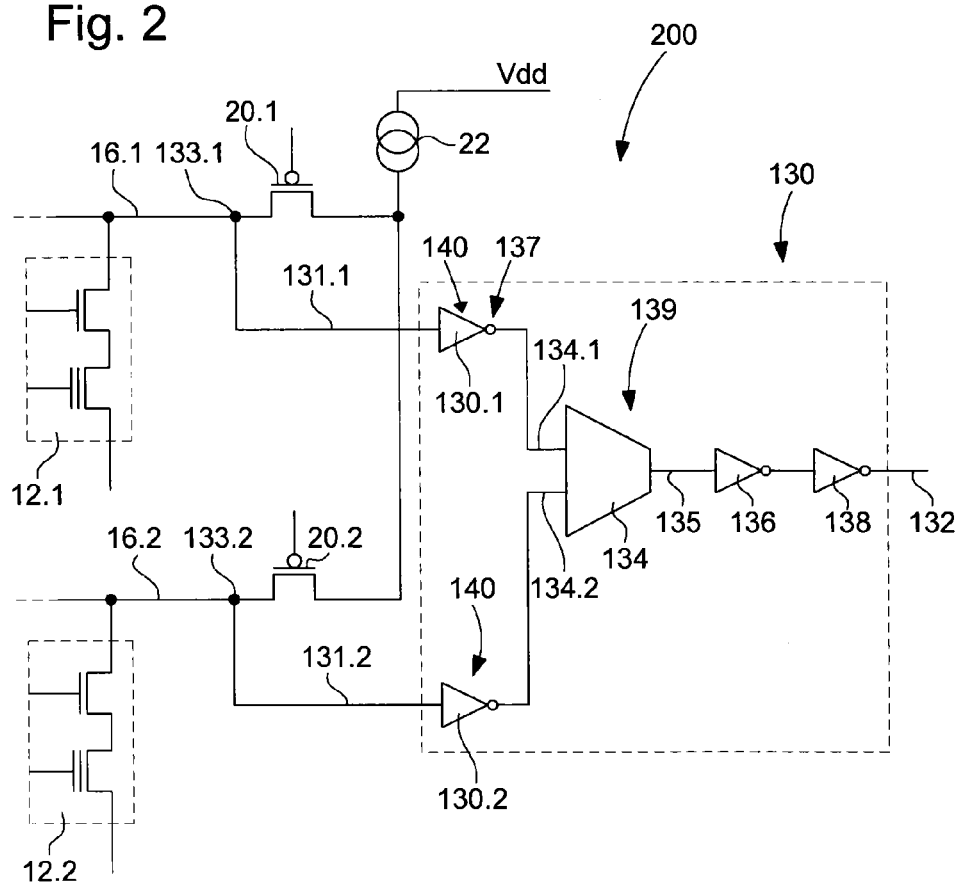
FIG. 2 shows a PMOS-type implementation of the memory circuit with two bit cells.

In FIG. 2, a further memory circuit 200 is shown that comprises two bit cells 12.1, 12.2. The general architecture of the memory circuit 200 is based on the architecture of the PMOS implementation according to FIG. 1. It is likewise also implementable in the NMOS architecture as shown in FIG. 3.

The memory circuit 200 comprises also a first and a second bit-line 16.1, 16.2. Here, the first bit-line 16.1 is connected to the first bit cell 12.1. The second bit-line 16.2 is connected to the second bit cell 12.2. There are further provided two current switches 20.1, 20.2. Hence, for each bit-line and for each bit cell, there is provided one current switch 20.1, 20.2. These current switches 20.1, 20.2 are connected to a common current source 22. With regard to the current source 22 first and second current switches 20.1, 20.2 are arranged in parallel.

The sense amplifier 130 is shown by the dashed rectangular structure. The sense amplifier 130 comprises a first amplifier stage 137 and a second amplifier stage 139. The first amplifier stage 137 comprises a first amplifier circuit 130.1 and a second amplifier circuit 130.2. Likewise, the sense amplifier 30 as described in connection with the embodiment according to FIG. 1, each of the first and second amplifier circuits 130.1, 130.2 comprises an inverter 140. The first amplifier circuit 130.1 comprises a first input 131.1 being connected to a first sensing node 133.1. Corresponding to the embodiment according to FIG. 1 said first sensing node 133.1 is connected to the first bit-line 16.1. It is located between the first bit cell 12.1 and the first current switch 20.1.

Likewise, also the second amplifier circuit 130.2 comprises a second input 131.2 that is connected to a second sensing node 133.2. The second sensing node 133.2 is connected to the second bit-line 16.2. It is located between the second memory cell 12.2 and the second current switch 20.2.

First and second amplifier circuits 130.1, 130.2 or first and second inverters 140 thereof are implemented as high voltage devices. Hence, the inverters 140 constituting or belonging to the first and second amplifier circuits 130.1, 130.2 are high voltage tolerant. Hence, voltage levels on the bit-lines 12.1, 12.2 suitable for erasing or writing data in the first or second bit cells 12.1, 12.2 are separated and isolated from the second stage 139 of the sense amplifier 130.

The outputs of first and second amplifier circuits 130.1, 130.2 are connected to inputs 134.1, 134.2 of a data multiplexer 134 of the second stage 139 of the sense amplifier 130. The data multiplexer 134 is coupled to the current switches 20.1, 20.2. For reading of the first memory cell 12.1, for instance, the first current switch 20.1 is switched on and the respective signals obtainable from the first amplifier circuit 130.1 are switched to the data multiplexer 134. The output 135 of the data multiplexer 134 then forms the output 132 of the sense amplifier 130. In the embodiment as illustrated in FIG. 2, there are further shown two inverters 136, 138 in series at the output 135 of the data multiplexer 134 that form an output buffer.

The implementation of the memory circuit 200 is by no way limited to only two bit cells 12.1, 12.2. The architecture and concept as shown in FIG. 2 is expandable to n bit cells 12.1, . . . , 12.n. Then, n bit-lines 16.1, . . . , 16.n are provided each equipped with an own current switch 20.1, . . . , 20.n. The first stage 137 of the sense amplifier 130 then also has n amplifier circuits 130.1, . . . , 130.n, and the data multiplexer 134 of the sense amplifier 130 comprises n inputs each of which connected to one output of the n amplifier circuits 130.1, . . . , 130.n.

Since the input 31, 131 of the sense amplifier 30, 130 is directly connected to the bit-line 16 or to the bit-lines 16.1, 16.2, the input voltage level of the sense amplifier 130 can be as high as the supply voltage Vdd. In this way and if the memory circuits 10, 100, 200 are in a read mode, the supply voltage level can be reduced thus saving energy without the necessity to provide a charge pump circuit.

Figure 4:
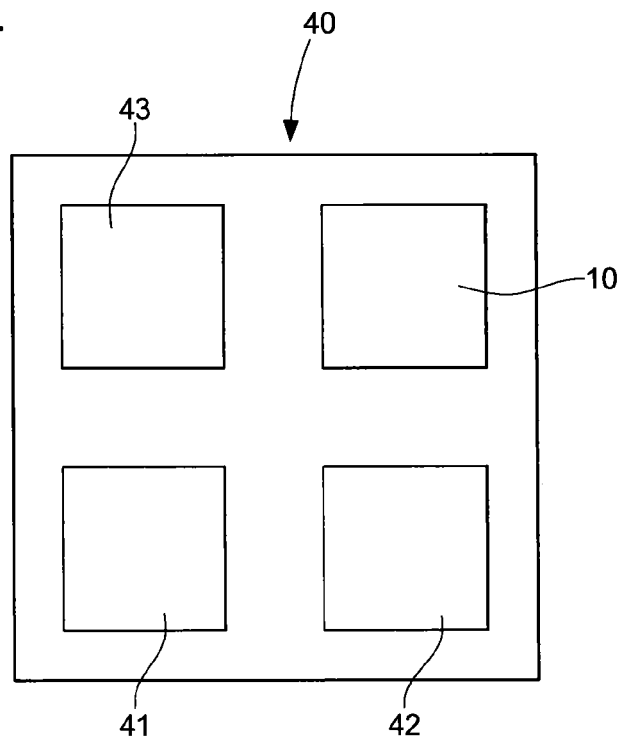
FIG. 4 schematically shows an electronic device comprising such a memory circuit.

Furthermore, in FIG. 4 an electronic device 40 is schematically illustrated. The electronic device 40 comprises a processor 41 and an energy supply 42 as well as an input or output 43 and a memory circuit 10, 100 or 200 as described above. The electronic device 40 may be configured as a portable electronic device. The energy supply 42 may therefore be implemented as a battery, a rechargeable battery or a solar cell or combinations thereof. The input or output 43 may comprise a touchscreen, a keyboard or some other input devices. When implemented as an output the input/output 43 typically comprises at least one of a display, speakers or a means to generate a tactile signal, such like a vibrator. The memory circuit 200 is at least connected in a data transferring way to the processor 41. It may be further directly connected to the energy supply 42 as well as to the input or output 43.

What is claimed is:

1. A memory circuit, comprising:
   at least one bit cell configured to store data and having a first terminal and a second terminal, wherein one of said terminals is coupled to a bit-line;
   at least one current switch connected to the bit-line and connected to a current source and being configured to selectively provide at least a read current to the bit cell; and
   a sense amplifier having at least one input connected to a sensing node on the bit-line, wherein the sensing node is disposed between the bit cell and the at least one current switch.

2. The memory circuit according to claim 1, wherein the at least one current switch comprises a PMOS transistor comprising a source and a drain, one of which being connected to the current source and the other one of which being connected to the bit-line.

3. The memory circuit according to claim 2, wherein the first terminal of the memory cell is connected to the bit-line.

4. The memory circuit according to claim 1, wherein the at least one current switch comprises a NMOS transistor comprising a source and a drain, one of which being connected to the current source and the other one of which being connected to the bit-line.

5. The memory circuit according to claim 4, wherein the second terminal of the memory cell is connected to the bit-line.

6. The memory circuit according to claim 1, wherein:
   the at least one bit cell comprises at least a first bit cell and a second bit cell;
   the bit line comprises at least a first bit-line and a second bit-line coupled to the first and to the second bit cells, respectively; and
   the at least one current switch comprises at least a first current switch and a second current switch connected to the first and to the second bit-lines, respectively, and connected to the current source and being configured to selectively provide at least a read current to one of the first and second bit cells.

7. The memory circuit according to claim 6, wherein the sense amplifier has a first amplifier stage comprising:
   at least a first amplifier circuit connected to a first sensing node on the first bit-line, wherein the first sensing node is disposed between the first bit cell and the first current switch; and
   at least a second amplifier circuit connected to a second sensing node on the second bit-line, wherein the second sensing node is disposed between the second bit cell and the second current switch.

8. The memory circuit according to claim 7,
   wherein the sense amplifier further comprises a data multiplexer in a second amplifier stage, and
   wherein the data multiplexer is individually connected with outputs of each of the first and second amplifier circuits of the first amplifier stage.

9. The memory circuit according to claim 8, wherein the data multiplexer and the at least the first and second current switches are mutually coupled and configured to synchronously switch to only one of the at least the first and second bit cells.

10. The memory circuit according to claim 6, wherein at least one of the first and the second amplifier circuits comprises an inverter directly connected to the respective bit cell.

11. The memory circuit according to claim 6, wherein the at least the first and second amplifier circuits are at least to voltage levels so as to be configured to erase or to write data in the first or second bit cells.

12. The memory circuit according to claim 6, further comprising:
   n bit cells and n bit-lines, wherein one of the n bit-lines is coupled to one of the n bit cells, and
   n current switches connected to the current source,
   wherein one of the n current switches is connected to one of the n bit-lines, respectively.

13. The memory circuit according to claim 6, further comprising n amplifier circuits connected to n sensing nodes on n bit-lines.

14. An electronic device, comprising:
   a processor;
   an electric energy supply;
   at least one of an input or output; and
   at least one memory circuit, comprising:
      at least one bit cell configured to store data and having a first terminal and a second terminal, wherein one of said terminals is coupled to a bit-line, at least one current switch connected to the bit-line and connected to a current source and being configured to selectively provide at least a read current to the bit cell, and a sense amplifier having at least one input connected to a sensing node on the bit-line, wherein the sensing node is disposed between the bit cell and the at least one current switch.

15. A memory circuit, comprising:

at least a first and a second bit cells for storing data and each having a first terminal and a second terminal, at least a first and a second bit-lines coupled to the first and to the second bit cells, respectively, at least a first and a second current switches connected to the first and to the second bit-lines, respectively, and connected to the current source and being operable to selectively provide at least a read current to one of the first and second bit cells, a sense amplifier having at least a first input connected to a first sensing node on the first bit-line, wherein the first sensing node is located between the first bit cell and the at least one current switch, and having at least a second input connected to a second sensing node on the second bit-line, wherein the second sensing node is located between the second bit cell and the at least one current source.

16. The memory circuit according to claim 15, wherein the sense amplifier has a first amplifier stage comprising:

at least a first amplifier circuit connected to the first sensing node on the first bit-line, wherein the first sensing node is disposed between the first bit cell and the first current switch; and at least a second amplifier circuit connected to the second sensing node on the second bit-line, wherein the second sensing node is disposed between the second bit cell and the second current switch.

17. The memory circuit according to claim 16, wherein the sense amplifier further comprises a data multiplexer in a second amplifier stage, and wherein the data multiplexer is individually connected with outputs of each of the first and second amplifier circuits of the first amplifier stage.

18. The memory circuit according to claim 17, wherein the data multiplexer and the at least the first and second current switches are mutually coupled and configured to synchronously switch to only one of the at least the first and second bit cells.

19. The memory circuit according to claim 16, wherein at least one of the first and the second amplifier circuits comprises an inverter directly connected to the respective bit cell.

20. The memory circuit according to claim 16, wherein the at least the first and second amplifier circuits are at least to voltage levels so as to be configured to erase or to write data in the first or second bit cells.

21. The memory circuit according to claim 15, further comprising:

n bit cells and n bit-lines, wherein one of the n bit-lines is coupled to one of the n bit cells; and n current switches connected to the current source, wherein one of the n current switches is connected to one of the n bit-lines, respectively.

22. The memory circuit according to claim 15, further comprising n amplifier circuits connected to n sensing nodes on n bit-lines.

* * * * *